(12) United States Patent
Medina et al.

(10) Patent No.: US 8,693,074 B2
(45) Date of Patent: *Apr. 8, 2014

(54) MOEMS APPARATUS AND A METHOD FOR MANUFACTURING SAME

(71) Applicant: STMicroelectronics International N.V., Amsterdam (NL)

(72) Inventors: Moshe Medina, Haifa (IL); Pinchas Chaviv, Hod-HaSharon (IL); Yaron Fein, Rehovot (IL)

(73) Assignee: STMicroelectronics International N.V., Amsterdam (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/663,550

(22) Filed: Oct. 30, 2012

(65) Prior Publication Data
US 2013/0050793 A1    Feb. 28, 2013

Related U.S. Application Data

(63) Continuation of application No. 13/320,828, filed as application No. PCT/IL2009/000516 on May 24, 2009, now Pat. No. 8,305,670.

(51) Int. Cl.
*G02B 26/08*    (2006.01)
*G03F 7/00*    (2006.01)

(52) U.S. Cl.
USPC .................. 359/199.4; 359/198.1; 359/200.8; 359/900; 430/316; 430/323

(58) Field of Classification Search
USPC ............. 359/199.2, 199.4, 200.6, 200.8, 245, 359/295, 298, 900; 438/689, 706, 735–737; 216/2; 310/309; 430/5, 316, 322
See application file for complete search history.

(56) References Cited

U.S. PATENT DOCUMENTS

| | | | |
|---|---|---|---|
| 6,713,367 B2 | 3/2004 | Solgaard et al. | |
| 7,069,784 B1 | 7/2006 | Eskridge | |
| 7,177,063 B2 | 2/2007 | Krylov et al. | |

FOREIGN PATENT DOCUMENTS

| | | |
|---|---|---|
| EP | 1792870 A2 | 6/2007 |
| WO | WO-2009026232 A1 | 2/2009 |

OTHER PUBLICATIONS

International Search Report and Written Opinion for PCT/IL2009/000516 mailed Mar. 31, 2010 (10 pages).
Sun Y et al: "A High-Aspect-Ratio Two-Axis Electrostatic Microactuator With Extended Travel Range," Sensors and Actuators A. Elsevier Sequoia S.A., Lausanne, CH, vol. 102, No. 1-2, Dec. 1, 2002, pp. 46-60.
Cho et al.: "Electrostatic 1D Micro Scanner With Vertical Combs for HD Resolution Display," Procedures of SPIE, vol. 6466 (2007); pp. 1-12.

*Primary Examiner* — James Phan
(74) *Attorney, Agent, or Firm* — Gardere Wynne Sewell LLP; Andre M. Szuwalski

(57) ABSTRACT

An apparatus is formed from a double active layer silicon on insulator (DSOI) substrate that includes first and second active layers separated by an insulating layer. An electrostatic comb drive is formed from the substrate to include a first comb formed from the first active layer and a second comb formed from the second active layer. The comb drive may be used to impart a tilting motion to a micro-mirror. The method of manufacturing provides comb teeth exhibiting an aspect ratio greater than 1:20, with an offset distance between comb teeth of the first and second combs that is less than about 6 μm.

30 Claims, 3 Drawing Sheets

MOEMS APPARATUS AND A METHOD FOR MANUFACTURING SAME

PRIORITY CLAIM

The present application is a continuation of U.S. Pat. No. 8,305,670 filed Nov. 16, 2011, which is a 371 filing from PCT Application PCT/IL09/00516 filed May 24, 2009, the disclosures of which are hereby incorporated by reference.

TECHNICAL FIELD

The present invention relates generally to micro optical electro-mechanical devices and their manufacturing process and more particularly to methods for improving the accuracy of the etching step in the process of manufacturing such devices.

BACKGROUND

Nowadays many MOEMS (Micro Optical Electro-Mechanical Systems) applications use a tilting motion of a deformable element (e.g., an element used for tilting micro mirrors). State-of-the-art electrostatic actuating devices are configured with an angular degree of freedom and are driven by electrostatic forces. Electrostatic comb drives can be divided to an in-plane comb drive ("IPCD") and vertical comb drive ("VCD").

The IPCD and VCD actuators are used to generalize the working principle of a double-sided comb-drive actuator and to obtain an angular motion. They are constructed from two sets of combs, a moving part (henceforth referred to as the rotor) and static part (henceforth referred to as the stator) interlaced together. See, for example, the MOEMS illustrated in FIGS. 1A and 1B. The use of the two combs forms a free space capacitor, whereas the motion between the two combs changes the capacitance of the free-space capacitor thus formed. Accordingly, upon applying a voltage difference between the stator and rotor combs, a vertical electrostatic force is induced that creates a tilt motion. However, in addition to the tilt motion, the applied voltage difference might also produce unwanted vertical and lateral motions of the mirror. FIG. 1C illustrates an example of a schematic cross-sectional view of the pure rotational actuation (about an axis perpendicular to the plane of the illustration). In this example, the forces that cause unwanted vertical and lateral piston motions are canceled by the symmetric layout of the comb stators. The electrostatic forces are generated in the gaps between the combs shown in FIG. 1B. Since the capacitance of a capacitor as described above is mainly influenced by its geometric shape, the dimensions of the combs strongly influence the obtained electrostatic force. A larger electrostatic force can be acquired when the aspect ratio increases (wherein the aspect ratio is defined as the ratio between the height of the comb and the distance between adjacent teeth comprised in the comb).

Several methods are known in the art for fabricating a VCD. These prior art methods can generally be segmented to methods for fabricating the VCD from two device layer wafers, which may be considered as a "self aligned" mode and methods for fabricating each of the combs of the VCD separately, using a different wafer followed by bonding the two (rotor and stator) wafers to create a single VCD. An example of such a self aligned mode for fabricating a VCD is described in U.S. Pat. No. 6,713,367, the disclosure of which is hereby incorporated by reference. The method described by this publication includes the steps of etching in a semiconductor wafer a first comb with a coarse set of teeth, then a second semiconductor wafer is bonded to the first set of teeth, and another set of teeth is etched in the second wafer with teeth overlapping the teeth in the first comb. Even though both top and bottom comb teeth of the VCD actuator are defined by a single fabrication mask, the difficulty of this method lies in the fact that it highly depends upon the accuracy of the machine to obtain sufficiently accurate alignment.

The problems associated with a wafers bonding method are described in length by Jin-Woo Cho, et al., "Electrostatic 1D Micro Scanner with Vertical Combs for HD resolution Display", Proc. of SPIE, vol. 6466 (2007). Basically a relative small divergence (even one that is within the system's tolerance) in aligning both wafers, might result in electric shortage between overlapping comb's teeth. Thus, current VCD fabrication methods provide a VCD having a relatively low aspect ratio.

There is a need in the art to provide an electrostatic comb drive characterized by having small distances between adjacent comb teeth and by having high accuracy alignment between its two active layers.

SUMMARY

According to an embodiment, a MOEMS apparatus is provided which comprises a double active layer silicon on insulator (DSOI) substrate that includes two active layers separated by an insulating layer. The apparatus comprises an electrostatic comb drive that includes a stator formed in a first of the two active layers and a rotor formed in the second of the two active layers. At least one of the distances created between a tooth belonging to said rotor and an adjacent tooth belonging to said stator is smaller than 6 μm. Furthermore, the aspect ratio for the comb structure of said apparatus is greater than 1:20.

While embodiments are described in the context of as a MOEMS apparatus which comprises a double active layer silicon on insulator (DSOI) substrate, it should be understood to encompass any MOEMS apparatus which comprises more than two active layers of silicon on insulator (DSOI) substrate as described herein.

According to another embodiment, the electrostatic comb drive comprised in the MOEMS apparatus is selected from among a vertical comb drive and an in-plane comb drive.

According to yet another embodiment, each of the rotor and stator comprised in the MOEMS apparatus are etched in with an accuracy of ±0.5 μm.

In accordance with yet another embodiment, the electrostatic comb drive is operative under pull-in voltage that is higher than 300V.

According to another embodiment, a method for fabricating a MOEMS apparatus from a double active layer silicon on insulator (DSOI) substrate that includes two active layers separated by an insulating layer comprises: a) etching in the first active layer a first plurality of designated shapes and at least one cavity adapted to be used as a marker; b) etching in the second active layer at least one cavity at a location that essentially corresponds to the location of the at least one cavity that has been etched in the first active layer; c) identifying through the at least one cavity etched in the second active layer, the location of the at least one marker cavity etched in the first active layer; d) based upon the identification step, determining at least one reference point at the second active layer for etching a second plurality of designated shapes thereat; and e) in the second active layer, etching a second plurality of designated shapes located at pre-determined distances from the at least one reference point.

According to another embodiment, etching the plurality of designated shapes and the at least one marker in the first active layer are carried out simultaneously.

According to another embodiment, the thickness of the insulating layer (e.g. the oxide layer) that separates the first and second active layers is determined so as to enable light passing through the at least one marker cavity that was etched in the first active layer, to reach the cavity etched in the second active layer.

According to yet another embodiment, the method further comprises enlarging the at least one cavity etched in the second active layer, in case that one or more of the at least one marker cavities etched in the first active layer have not been properly identified.

According to another embodiment, the at least one marker cavity is included in the first plurality of designated shapes, thereby saving on the need to etch the at least one marker cavity in addition to the etching of that first plurality of designated shapes.

According to still another embodiment, the method further comprises converting the two layers device obtained by etching the first layer and the second layer, into a one layer device, by collapsing these two layers into a one layer device (e.g., by converting a vertical comb drive (VCD) engine into a very high aspect ratio in-plane comb drive (IPCD) engine).

In an embodiment, an electrostatic comb drive is provided with an aspect ratio greater than 1:20. The drive is configured in a manner so as to eliminate the possibility of an electric short due to overlapping of the comb teeth.

In an embodiment, a method is provided for fabricating an electrostatic comb drive having small distances between adjacent comb teeth, thereby enabling to achieve high electrostatic force for actuation of a structure such as a micro mirror when using such a device.

In an embodiment, the fabrication process allows for achieving alignment accuracy that is better than ±0.5 µm.

It an embodiment, the fabrication process enables achieving accurate etching through two device layers with unlimited thickness of insulating (oxide) layer therebetween.

BRIEF DESCRIPTION OF THE DRAWINGS

For a more complete understanding of the present invention, reference is made to the following detailed description taken in conjunction with the accompanying drawings wherein:

FIGS. 1A and 1B present a typical MOEMS electrostatic comb drive;

DETAILED DESCRIPTION OF THE DRAWINGS

Figure 1C:
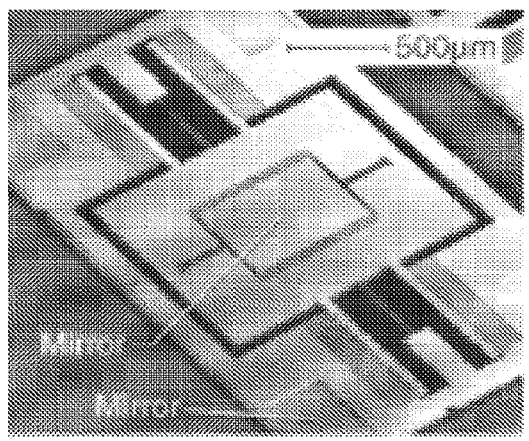
FIG. 1C demonstrates an example of a schematic cross-sectional view of the pure rotation actuation.
Figure 1C:
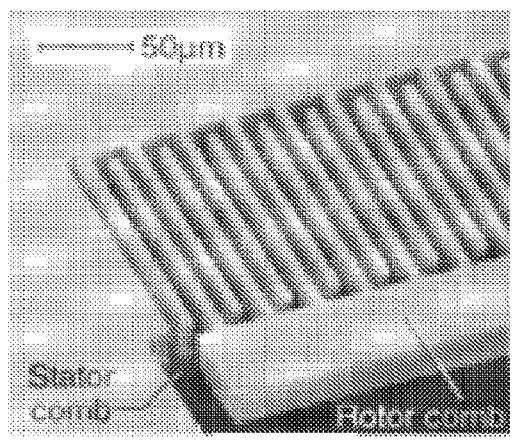
Figure 1C:
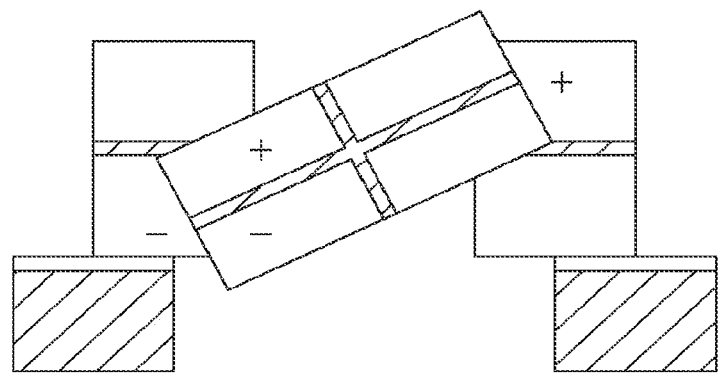
Figure 1C:
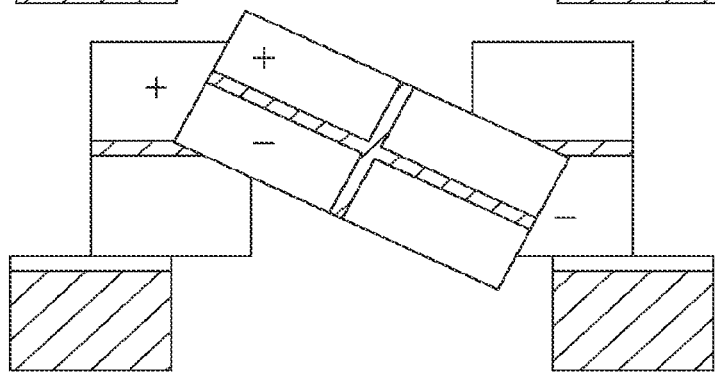
Figure 1D:
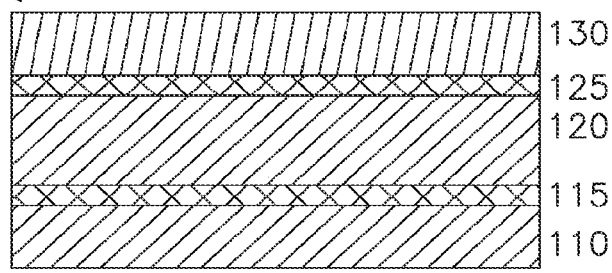
FIG. 1D presents a schematic example of a pre-fabricated DSOI wafer.

Reference is now made to FIG. 1D which presents a schematic example of a pre-fabricated commercially available double-active-layer SOI (Double Silicon on Insulator, "DSOI") wafer 100 prior to further processing. The DSOI wafer typically comprises either a substrate and two active layers or a substrate and one active layer, wherein the substrate itself is used as one of the two active layers. The active layer(s) and the substrate are bonded together before the starting of the fabrication process. The DSOI presented in FIG. 1D has (from bottom to top) a first active layer 110, an oxide layer 115, a second active layer 120, an oxide layer 125 and a silicon substrate 130. Each of the three semiconductor layers (i.e., first active layer 110, second active layer 120 and substrate 130) is electrically isolated from the other layers by a respective one of the oxide layers 115 and 125. Oxide layer 115 is located between the first and second active layers 110 and 120, and oxide layer 125 is located between the second active layer and the substrate 120 and 130. Each active layer 110 and 120 may have a thickness of a few to a few tens of microns, whereas the oxide layers 115 and 125 are typically narrower (i.e., thinner) than the active layers 110 and 120 with a thickness of less than a micron to a few microns.

The steps of a process used for fabricating a comb structure for vertical comb drive are shown in FIGS. 2A-2F. As will be appreciated by those skilled in the art, the process exemplified herein is one example of fabricating a comb structure for vertical comb drive out of several processes or certain variations in the process described herein, that can be carried out without departing from the scope of the present invention.

Figure 2A:
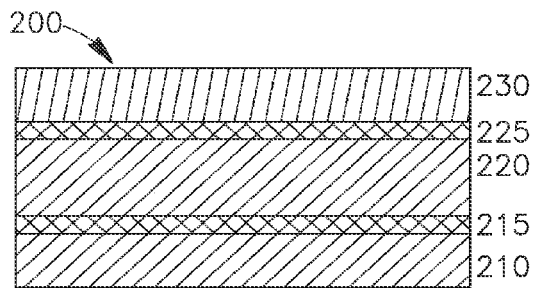
FIGS. 2A to 2F present a schematic side view of the fabrication of the electrostatic comb drive.

All dimensions of the respective layers and of resulting product of the process should be understood as being illustrative for demonstration purposes only. A typical wafer 200 is shown in FIG. 2A which comprises two active layers 210 and 220, a substrate layer (handle) 230 and two oxide layers 215 and 225. Oxide layer 215 separates the first active layer 210 from the second active layer 220, whereas oxide layer 225 separates the second active layer 220 from substrate 230.

Figure 2D:
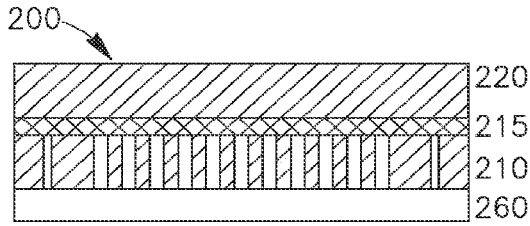
Figure 2B:
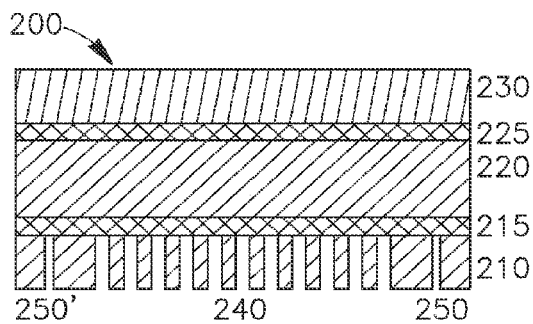

The first step of the process is shown in FIG. 2B where the first active layer 210 has been etched by applying a dry etch step, or by applying any other suitable process that is known in the art per se, in order to form the teeth of the stator 240. As will be appreciated by those skilled in the art, the disclosure should not be considered as being limited to which of the active layers would function as the rotor and which as the stator, although in this example the active layer 210 is designated to be used as the stator and active layer 220 is designated to be used as the rotor. During the step shown in FIG. 2B, in addition to etching cavities for defining the stator teeth the cavities for markers 250 and 250' are also etched. Since FIG. 2B illustrates a side view of the wafer, only two cavities 250 and 250' that are adapted to be used as markers are shown. Preferably, more cavities for markers are etched and provided (located on a different longitudinal axis), to provide a two dimensional match of the mask to be prepared for the etching of the second active layer. The etching of the cavities 250 and 250' for the markers is carried out with a depth up to the oxide layer 215 and is preferably carried out together with the etching of the teeth for the stator 240. The cavities 250 and 250' for the markers may be etched at pre-defined locations, but in addition or in the alternative, they may be etched in non pre-determined locations but preferably close to the edges of the first active layer 210 (so as not to interfere with the etching of stator 240).

Figure 2E:
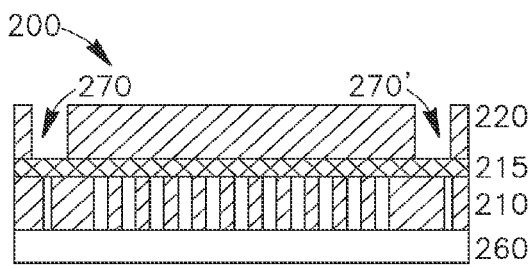
Figure 2C:
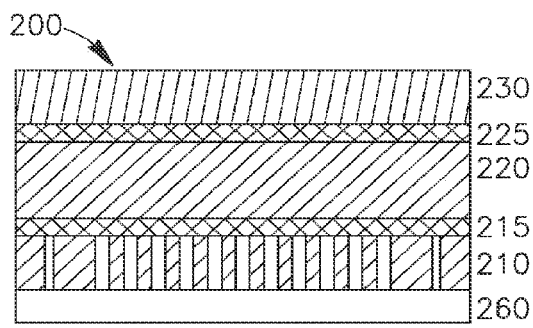

In the next step, shown in FIG. 2C, upon etching the cavities 250 and 250' for the markers and comb teeth for the stator 240, a glass layer 260 is bonded to the first active layer 210. Once wafer 200 is bonded to the glass layer 260, the substrate layer 230 and oxide layer 225 are removed as illustrated in FIG. 2D, thereby revealing the second active layer 220.

The next step is shown in FIG. 2E where two cavities 270 and 270' are etched in active layer 220. These two cavities 270 and 270' are centered approximately in places that would match the centers of the cavities 250 and 250' for the markers previously etched in the first active layer. Accuracy in the etching of the cavities 270 and 270' is not highly important because these cavities are used for providing one or more reference points for etching the second active layer. Once cavities 270 and 270' are etched, cavities 250 and 250' for the markers become visible when viewing from above the top surface of the second active layer 220 (i.e., viewing from the surface in which the cavities 270 and 270' are formed) because the oxide layer 215 is very thin and is thus practically transparent.

Figure 2F:
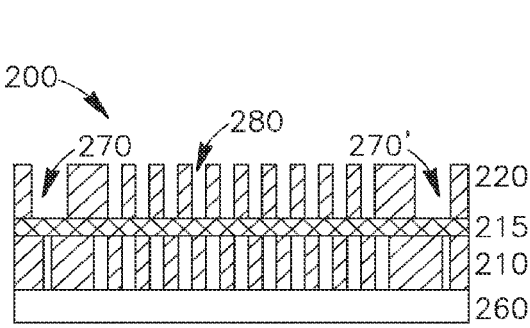

The next step is illustrated in FIG. 2F, where the locations of the cavities 250 and 250' for the markers are used as reference points for preparing a mask to be used for etching active layer 220 in the exact designated places so that a precise etching of cavities for forming the comb teeth of the rotor 280 is achieved that are complementary to the comb teeth of the stator 240. Applying the suggested method allows fabricating a vertical comb drive with an accuracy that is higher than any accuracy that may be achieved while implementing another fabricating method known in the art. The aspect ratio obtained while using the above method was higher than 1:40 and the accuracy obtained better than ±0.5 µm.

Figure 3A:
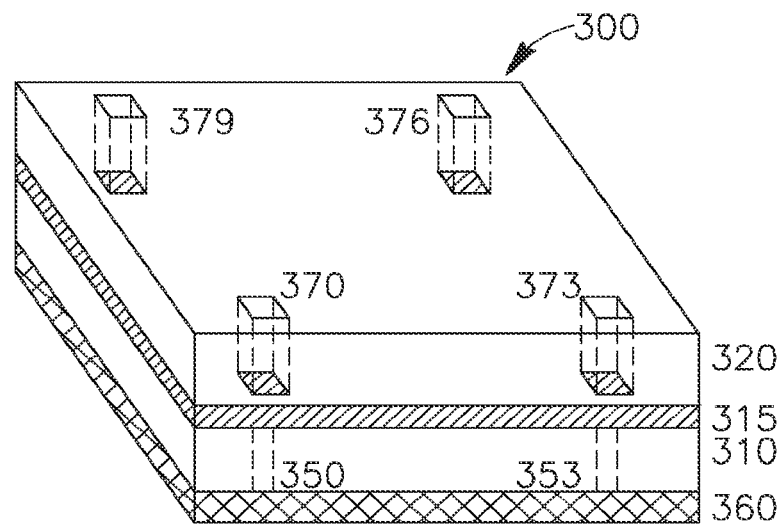
FIGS. 3A and 3B present an example of cavities deployed in a DSOI wafer for use as markers.
Figure 3B:
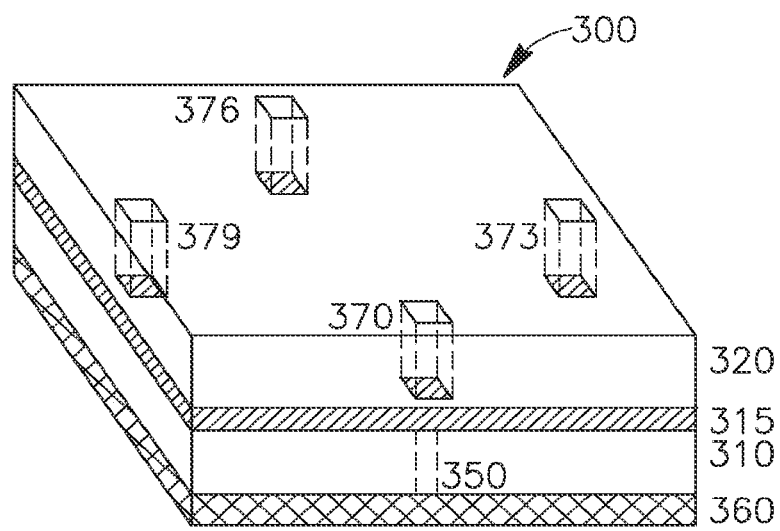

FIGS. 3A and 3B illustrate two examples of deploying cavities for markers according to an embodiment in a DSOI wafer. FIGS. 3A and 3B show a wafer 300 in which various cavities are etched (but without showing the etched rotor comb, see FIG. 2F). The illustrated DSOI wafer comprises a first active layer 310, a second active layer 320, an oxide layer 315 separating the first and the second active layers, and a glass layer 360 bonded to the active layer 310. Cavities 350 and 353 (along with other cavities not shown in this illustration) are used as marker cavities. Once the marker cavities are etched, the cavities 370, 373, 376 and 379 are etched in the second active layer 320 at locations that essentially match the location of the marker cavities 350 and 373 present in the first layer. The etching of the cavities 370, 373, 376 and 379 is carried out to a depth reaching the oxide layer 315. Thereafter, the exact locations of the centers of the marker cavities 350 and 353 are identified and compared each with the centers of the respective cavities 370, 373, 376 and 379 etched in the second layer 320. Upon determining the match between the centers of the marker cavities 350 and 353 and the second layer cavities 370, 373, 376 and 379, any offset may be identified or calculated and based thereon, the masking for etching the second layer device can be prepared.

A similar process is described in FIG. 3B where the four marker cavities (of which only 350 is shown in this illustration) and their corresponding cavities 370, 373, 376 and 379 of the second layer, are located at different locations to enable a different way of obtaining reference points for masking that would allow etching the second active layer with the required accuracy.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method, comprising:

forming a first plurality of cavities defining a first plurality of comb teeth in a first active layer;

forming a marker cavity in the first active layer, said marker cavity extending to an insulation adjacent the first active layer;

forming an additional cavity in a second active layer opposite the first active layer and separated from the first active layer by the insulation, said additional cavity corresponding to said marker cavity and extending to the insulation;

locating the marker cavity in the first active layer through the additional cavity in the second active layer;

using the located marker cavity to define a reference point for a mask on the second active layer; and forming through said mask a second plurality of cavities defining a second plurality of comb teeth in the second active layer.

2. The method of claim 1, wherein an aspect ratio of the cavities defining the first and second pluralities of comb teeth is greater than 1:20.

3. The method of claim 1, wherein a distance between a tooth in the first plurality of comb teeth and an adjacent tooth in the second plurality of comb teeth is less than 6 µm.

4. The method of claim 1, wherein the second plurality of comb teeth in the second active layer are positioned complementary of the first plurality of comb teeth in the first active layer.

5. The method of claim 1, wherein forming the first plurality of cavities and opening the marker cavity is performed using a simultaneous etch.

6. The method of claim 1, wherein the insulation is transparent.

7. The method of claim 1, further comprising enlarging the additional cavity in the second active layer if the marker cavity in the first active layer cannot be located through the additional cavity.

8. The method of claim 1, wherein the marker cavity has a smaller opening than the additional cavity.

9. The method of claim 1, wherein the reference point has a location accuracy with respect to the marker cavity of ±0.5 µm.

10. The method of claim 1, further comprising determining a center offset between the marker cavity and the additional cavity, and aligning an etching mask in relation to the determined center offset.

11. The method of claim 1, wherein locating the marker cavity in the first active layer through the additional cavity in the second active layer comprises: determining a center location of the marker cavity, determining a center location of the additional cavity, and determining an offset between the determined center locations.

12. The method of claim 11, wherein using the located marker cavity to define the reference point comprises using the determined offset in masking.

13. The method of claim 12, wherein the second plurality of cavities defining the second plurality of comb teeth in the second active layer are located relative to the first plurality of comb teeth in the first active layer with an accuracy of ±0.5 µm.

14. A method, comprising:

etching in a first active layer of a double active layer silicon on insulator substrate a first plurality of designated shapes and at least one cavity adapted to be used as a marker, wherein the first active layer is separated from a second active layer by an insulating layer;

etching in said second active layer at least one cavity at a location that essentially corresponds to a location of said at least one marker cavity that has been etched in said first active layer;

identifying through said at least one cavity etched in said second active layer said at least one marker cavity etched in said first active layer;

based upon the identification, determining at least one reference point at said second active layer; and in said second active layer, etching a second plurality of designated shapes each located at a pre-determined distance from said at least one reference point.

15. The method according to claim 14, wherein etching said first plurality of designated shapes and said at least one marker cavity in said first active layer are carried out simultaneously.

16. The method according to claim 14, wherein a thickness of said insulating layer separating said first and second active layers is determined to enable light passing through said at least one marker cavity etched in said first active layer to reach the cavity etched in said second active layer.

17. The method according to claim 14, further comprising enlarging said at least one cavity etched in said second active layer in case that one or more of said at least one marker cavity etched in said first active layer have not been properly identified.

18. The method according to claim 14, further comprising converting a two layer device obtained by etching said first active layer and said second active layer into a one layered device.

19. The method according to claim 14, wherein said at least one marker cavity etched in said first active layer is included in said first plurality of designated shapes.

20. The method according to claim 14, further comprising collapsing a two layered device obtained by etching said first active layer and said second layer into a one layered device.

21. A method, comprising:

forming a first plurality of cavities in a first active layer;

forming a marker cavity in the first active layer, said marker cavity extending to an insulation adjacent the first active layer;

forming an additional cavity in a second active layer opposite the first active layer and separated from the first active layer by the insulation, said additional cavity corresponding to said marker cavity and extending to the insulation;

locating the marker cavity in the first active layer through the additional cavity in the second active layer;

using the located marker cavity to define a reference point for a mask on the second active layer;

forming through said mask a second plurality of cavities in the second active layer.

22. The method of claim 21, wherein the forming of the second layer is performed in reference to the reference point.

23. The method of claim 21, wherein forming the first plurality of cavities and forming the marker cavity is performed using a simultaneous etch.

24. The method of claim 21, further comprising enlarging the additional cavity in the second active layer if the marker cavity in the first active layer cannot be located through the additional cavity.

25. The method of claim 21, further comprising determining a center offset between the marker cavity and the additional cavity, and aligning a mask over the second active layer in relation to the determined center offset.

26. A method, comprising:

etching in a first active layer of a double active layer silicon on insulator substrate a first plurality of cavities and at least one marker cavity, wherein the first active layer is separated from a second active layer by an insulating layer;

etching in said second active layer at least one additional cavity at a location that oppositely corresponds to said at least one marker cavity;

identifying said at least one marker cavity etched in said first active layer optically through said at least one cavity etched in said second active layer;

based upon the identification, determining at least one reference point at said second active layer; and etching a second plurality of cavities in said second active layer located at distances offset from said at least one reference point.

27. The method according to claim 26, wherein etching said first plurality of cavities and said at least one marker cavity in said first active layer are carried out simultaneously.

28. The method according to claim 26, wherein said insulating layer separating said first and second active layers is thin enough to enable light passing through said at least one marker cavity etched in said first active layer to reach the additional cavity etched in said second active layer.

29. The method according to claim 26, further comprising enlarging said at least one additional cavity if the at least one marker cavity cannot be identified.

30. The method according to claim 26, wherein said at least one marker cavity comprises at least one of said plurality of cavities.

* * * * *